(12) United States Patent
Chankramath et al.

(10) Patent No.: US 6,546,524 B1
(45) Date of Patent: Apr. 8, 2003

(54) COMPONENT-BASED METHOD AND APPARATUS FOR STRUCTURED USE OF A PLURALITY OF SOFTWARE TOOLS

(75) Inventors: Ajay S. Chankramath, Union City, CA (US); Eamonn G. Ryan, Dublin (IE)

(73) Assignee: Xilinx, Inc., San Jose, CA (US)

( * ) Notice: Subject to any disclaimer, the term of this patent is extended or adjusted under 35 U.S.C. 154(b) by 170 days.

(21) Appl. No.: 09/741,312

(22) Filed: Dec. 19, 2000

(51) Int. Cl.[7] .............................................. G06F 17/50
(52) U.S. Cl. ..................... 716/4; 716/1; 716/5; 716/18; 702/121; 714/30
(58) Field of Search ...................... 716/1–21; 280/228; 333/33; 345/866; 356/394; 700/86, 97; 703/14; 705/1, 40, 52, 54; 707/100, 101; 709/220, 224, 316; 710/11; 713/194

(56) References Cited

U.S. PATENT DOCUMENTS 5,408,638 A  *  4/1995  Sagawa et al. ............... 716/20
5,801,958 A  *  9/1998  Dangelo et al. .............. 716/18
6,072,944 A  *  6/2000  Robinson ....................... 716/4
6,275,852 B1 *  8/2001  Filepp et al. ................ 709/220

* cited by examiner

*Primary Examiner*—Vuthe Siek
*Assistant Examiner*—Helen B Rossoshek
(74) *Attorney, Agent, or Firm*—LeRoy D. Maunu; Crawford PLLC (57) ABSTRACT

A component-based method and system for structured use of a plurality of software tools. In various embodiments, components are used to package objects that are constructed to test an electronic circuit design using different software tools. Flow files describe different execution sequences for selected ones of the plurality of software tools, and a first set of objects contains one or more methods for interfacing with a selected one or more of the flow files. A second set of objects contains one or more methods for collecting data from the software tools and entering the data in a database. The components include one or more methods that invoke one or more methods of the first and second sets of objects.

23 Claims, 6 Drawing Sheets

COMPONENT-BASED METHOD AND APPARATUS FOR STRUCTURED USE OF A PLURALITY OF SOFTWARE TOOLS

FIELD OF THE INVENTION

The present invention generally relates to testing electronic circuit designs, and more particularly to simplifying the process by which electronic circuit designs are tested.

BACKGROUND

Testing electronic circuit designs is generally a long and complicated process. The testing process involves a variety of software tools that process various design files and transform design information into a form that can be tested. For example, testing an electronic design for an FPGA entails a design database tool, a design mapping tool, a place-and-route (par) tool, a bitstream generator tool and a number of other tools. Each tool has its own particular set of parameters that can be used to tailor operation of the tool.

In conjunction running the various tools, various pre-processing and post-processing tasks are performed in the testing process. For example, before a tool is run, test data may need to be extracted from a repository. After a tool is run, data generated by the tool may need to be compared to an expected set of data. Those skilled in the art will recognize many other pre-processing and post-processing tasks that are associated with the tools.

Scripts are often developed and used to simplify the task of testing an electronic circuit design. A script saves a user from having to manually invoke the various pre-processing tasks, tools, and post-processing tasks. Scripts can also be modified for new and/or changed designs.

A variety of factors have led to the development of additional support software that is used in conjunction with the tools. The factors include, for example, the need to share design components, test data, and tools between projects and/or between geographically dispersed development sites. While the support software to various degrees have met these objectives, the complexity of the support software may limit its widespread usage.

A method and apparatus that address the aforementioned problems, as well as other related problems, are therefore desirable.

SUMMARY OF THE INVENTION

In various embodiments, the invention provides a component-based method and system for structured use of a plurality of software tools. In one embodiment, flow files describe different execution sequences for selected ones of the plurality of software tools, and a first set of objects contains one or more methods for interfacing with a selected one or more of the flow files. A second set of objects contains one or more methods for collecting data from the software tools and entering the data in a database. The components include one or more methods that invoke one or more methods of the first and second sets of objects. Implementing tests using the components supports reuse of software, simplifies test construction, and enhances portability.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

The many different tools, test data, and possible designs makes for an infinite number of possible test sequences. In order to make the process of designing and performing test sequences for electronic designs more efficient, object-oriented systems have been implemented to assist in reuse of test sequences in whole or in part.

Figure 1:
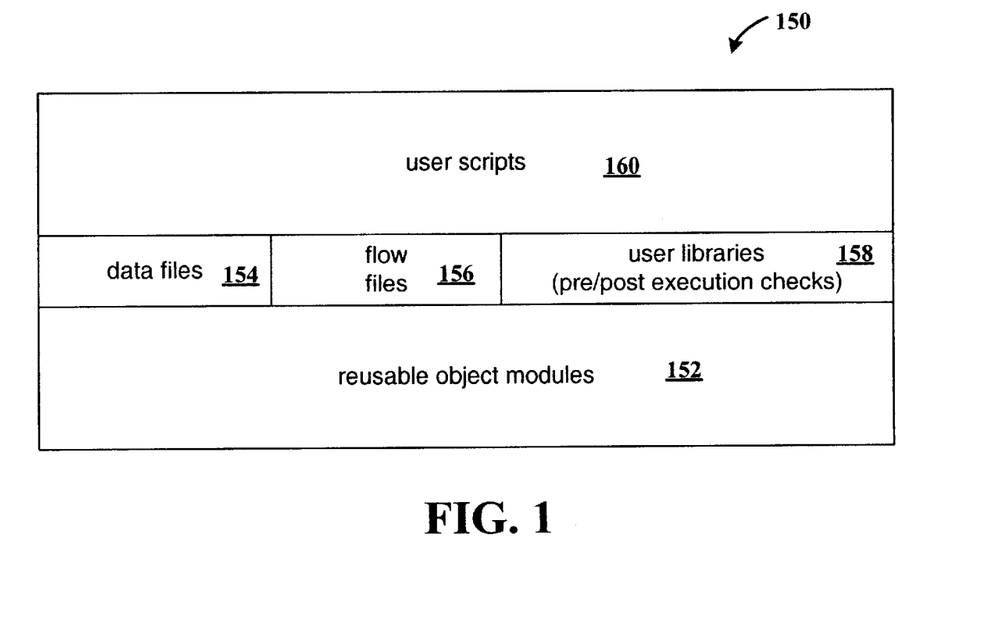
FIG. 1 illustrates the layers of software in an example object oriented system for testing electronic circuit designs.

FIG. 1 illustrates the layers of software in an example object oriented system for testing electronic circuit designs. System 150 includes at the lowest layer reusable object modules 152. Reusable object modules (ROMs) 152 are used and referenced in data files 154, flow files 156, and user libraries 158. User scripts 160 reference data files 154, flow files 156, and user libraries 158.

ROMs 152 include objects for setting up tests, executing tests, and collecting data from the tests. Data files 154 include generic and site-specific data that are used in performing a test sequence. For example, the data files include: 1) installation location (file server) of the software executables for different platforms for proprietary software and other third party interface software; 2) license server and data files for proprietary software and other third party software; and 3) generic site-specific environment data. A license server is software that controls execution of software tools in accordance with license rights granted for the tools.

Each of flow files 156 is a script that sets forth the tools to run and the sequence in which the tools are to be run for a particular test sequence. Generally, a flow file references ROMs 152 for performing pre-execution and post-execution processing for each of the tools accessed. User libraries 158 may also include special pre-execution and post-execution processing that is referenced in the flow files via ROMs 152.

User scripts 160 are created by a user and include logic that customizes a test sequence. For example, the user script validates a command line that starts the script, sets various environment variables, and sets up the tools before executing a flow file. The code below illustrates an example user script. Comments that describe the code are set off to the right of the code.

```
#!/devl/perl5/bin/perl
die "\nEnv Variable ROMS should be set.\n\n" if (! defined ($ENV{'ROMS'}));
use lib "$ENV{ROMS}/libs";
use lib "$ENV{ROMS}/ulibs";
use lib "$ENV{UROMS}/libs";
use lib "$ENV{UROMS}/ulibs";
use cadSet;
use testRun;
use testUtils;
use flowtest;
$SIG{INT} = \&testUtils::IntHandler;
my $TestObject = new testRun;                        } Validate Command Line
$TestObject->parseArgs(@ARGV);
$TestObject->varSet();
if (? $TestObject->caseVerify())
{                                                    } Set Variables and Check inputs
    die "Cannot find input test area\n";
}
$TestObject->dirCreate();
if (! $TestObject->getDataFromRepository())
{                                                    } Create directory and copy Data
    die "Cannot get data from REPOSITORY\n";
}
$TestObject->resultFileInit();
my $cs = new cadSet;
$cs->setupTools('xilinx');                           } Setup Tools
my $TestFlow = new flowtest;
if ($TestFlow->runApps($TestObject))
{                                                    } Execute and validate the flow
    $TestObject->cleanUp();
}
$TestObject->scriptExit();                           } Collect the data and exit
    }
```

In executing and validating the test flow, the flow file named "flowtest" is specified and the "runApps" method is called run the test. A ROM containing the "runApps" method is set forth in the example code below.

```
package flowtest;
BEGIN
{
    $flowtest::OPTF = "test.opt";
}
#------------------------------------------------
sub new
{
    my ($pkg) = shift;
    bless { }, $pkg;
}
#------------------------------------------------
sub runApps
{
    my ($obj) = shift;
    my ($testrun) = @_;
    use flowMaker;
    my $fm = new flowMaker;
    my ($apps, $pre, $post) = $fm->processFlowFile();
    my @numberApps = (keys(%$apps));
    for $app(1..$#numberApps+1)
    {
        if (! $testrun->runTest($app, $apps, $testrun->readOptFile($flowtest: :OPTF), $pre,
        $post))
            {
                return 0;
            }
    }
    return 1;
}
#------------------------------------------------
#-- Typical pre- and post- exec functions
sub CheckExists    {   (-f @_[0]) ? (return 1) : (return 0); }
sub CheckNotExists {   (-f @_[0]) ? (return 0) : (return 1); }
#-- checks whether there was an error in the exection
sub chkError
```

```
{
    my ($app, $log, $opfile) = @_;       }  Checks for core dump, ERROR,
    use testCheck;                          file INTERNAL_ERROR,
    my $TCHECK = new testCheck;             Incomplete PAR, Unroutes,
    return $TCHECK->checkTest($app, $log, $opfile);  Disk Space, Memory Probs, and
}                                          Outputs
1;
```

The runApps method calls the "testrun->runTest" method using the "flowtest" flow file. The flowtest flow file sets forth the tools to run in a desired sequence. An example flowtest flow file is set out below.

```
######################################################
# SYNTAX:

# <application_name>_pre_exec function_call()
# <application_name>[<Options>]
# <application_name>_post_exec function_call()

######################################################
ngdbuild_pre_exec flowtest::CheckExists(built.ngd)
ngdbuild
ngdbuild_post_exec flowtest::chkError(ngdbuild, ngdbuild.log, built.ngd)
map_pre_exec flowtest::CheckNotExists(built.ngd)
map
map_post_exec flowtest::chkError(map, map.log, mapped.ncd)
par_pre_exec flowtest::CheckNotExists(mapped.ncd)
par -ol 4 -c 2 -w mapped.ncd routed.ncd
par_post_exec flowtest::chkError(par, par.log, routed.ncd)
bitgen_pre_exec flowtest::CheckNotExists(routed.ncd)
bitgen routed.ncd
bitgen_post_exec flowtest::chkError(bitgen, bitgen.log, routed.bit)
ngdanno_pre_exec flowtest::CheckNotExists(mapped.ngm)
ngdanno routed.ncd -o routed.nga mapped.ngm
ngdanno_post_exec flowtest::chkError(ngdanno, ngdanno.log, routed.nga)
ngd2ver_pre_exec flowtest::CheckNotExists(routed.nga)
ngd2ver routed.nga routed.v
ngd2ver_post_exec flowtest::chkError(ngd2ver, ngd2ver.log, routed.v)
ngd2ver_pre_exec flowtest::CheckNotExists(routed.nga)
ngd2vhdl routed.nga routed.vhd
ngd2vhdl_post_exec flowtest::chkError(ngd2vhdl, ngd2vhdl.log, routed.vhd)
ngd2ver_pre_exec flowtest::CheckNotExists(routed.nga)
ngd2edif routed.nga routed.edn
ngd2edif_post_exec flowtest::chkError(ngd2edif, ngd2edif.log, routed.edn)
```

The example flow file invokes various example tools, such as ngdbuild, map, par, bitgen, etc. Before each tool is invoked, the CheckExists or CheckNotExists method is invoked to see whether the specified file exists. After each tool completes its processing, the chkError method is invoked to check for errors that may have occurred in running the tool. The CheckExists, CheckNotExists, and chkError methods are example methods of ROMs.

Figure 2:
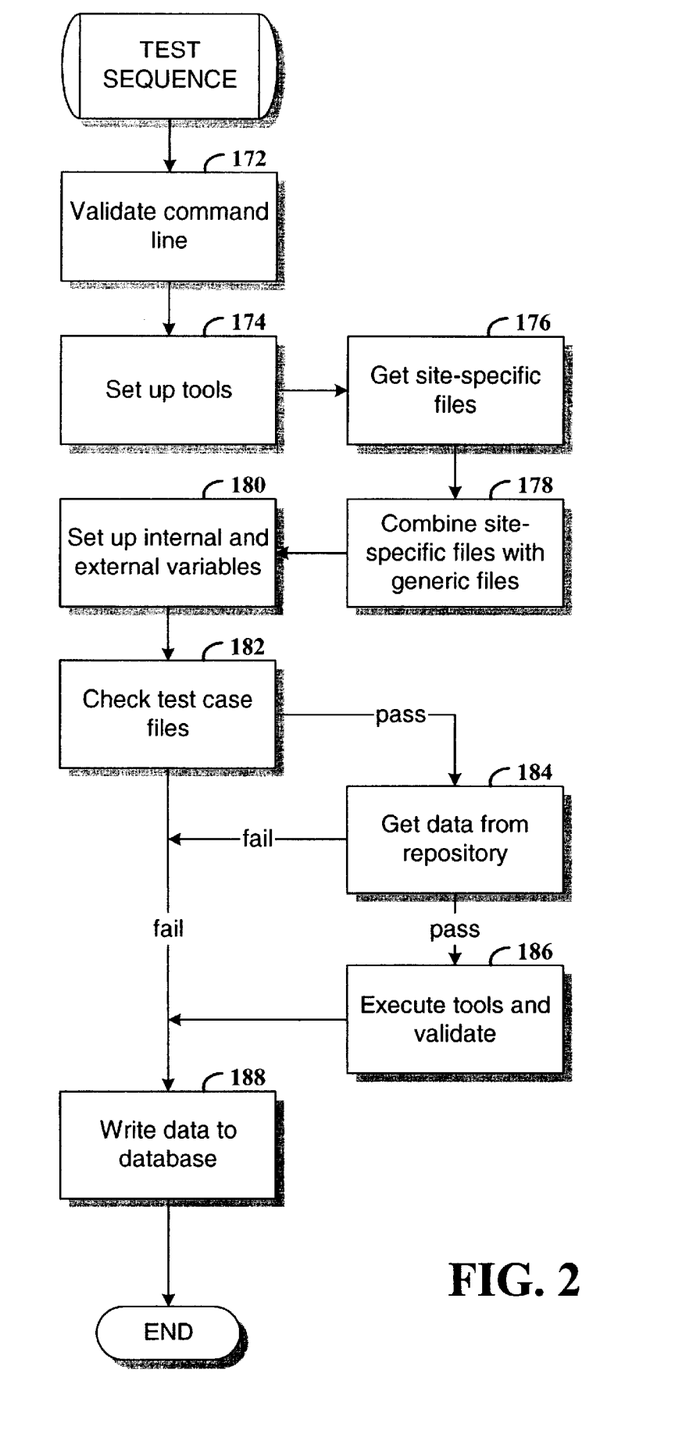
FIG. 2 is a flowchart of a process for testing an electronic circuit design in accordance with the example user script described above.

FIG. 2 is a flowchart of a process for testing an electronic circuit design in accordance with the example user script described above. At step 172, the command line entered by a user is validated for proper arguments and syntax. Based on the input arguments, at step 174 one or more tools are provided with input data based on arguments in the command line. At step 176, site-specific files are obtained for use with the tools. For example, each site may have different run-time libraries that are used in conjunction with the tools, and each site may have site-specific test drivers and data.

Generic data files are combined with the site-specific files at step 178. The generic data may include, for example, license numbers associated with the various tools that are used in the test flow. At step 180, values for various internal and external variables are established using the arguments from the command line, site-specific data, and generic data.

At step 182, the test case files are checked. Test case files are typically input files that represent the logical functionality of an electronic design as well as constraints and rules required in implementing this logical functionality in an electronic device such as an FPGA. The test case files are in the formats of EDIF, VHDL, and Verilog, for example. Step 182 checks for the existence of various acceptable input files with respect to a flow. If the test case files are acceptable, control is directed to step 184 to get data from a repository. The data obtained from the repository are the test case files. These files are physically obtained from the repository to be processed by the flow only when the criteria for existence of the right match of the files are found. If the data from the repository is acceptable, control is directed to step 186. At step 186, the tools are executed, and the result data is validated.

Control is directed to step 186 from step 182 if the test case files are unacceptable, from step 184 if the data from the repository is unacceptable, or from step 186 if the tools are executed. At step 188, data is written to a data base. The particular data that is stored depends upon the path from which step 188 was arrived at. If validation failed at step 182, an alert entry is written to the database so that the users can easily track this type of failure. In the event that step 184 fails to read the data from the repository, a specific failure tag is written to the database to indicate the type of failure. Once the tools are executed and completed at step 186, there are different types of data that are written. The data include, for example, a "pass" entry if all the conditions for passing a flow are met or a "fail" entry with status data to indicate the type of failure, if the flow fails.

From the descriptions of FIGS. 1 and 2, it will be appreciated that ROMs 152 and flow files 156 made reuse of test sequences easier in some respects. However, user libraries 158, and ROMs 152 may be so rich with functionality that a user of the ROMs and libraries may be overwhelmed with the complexity. Abstracting ROMs 152, data files 154, flow files 156, and user libraries 158 into components that are easy to understand and manipulate removes much of the complexity while retaining the benefits of a rich set of functionality.

Figure 3:
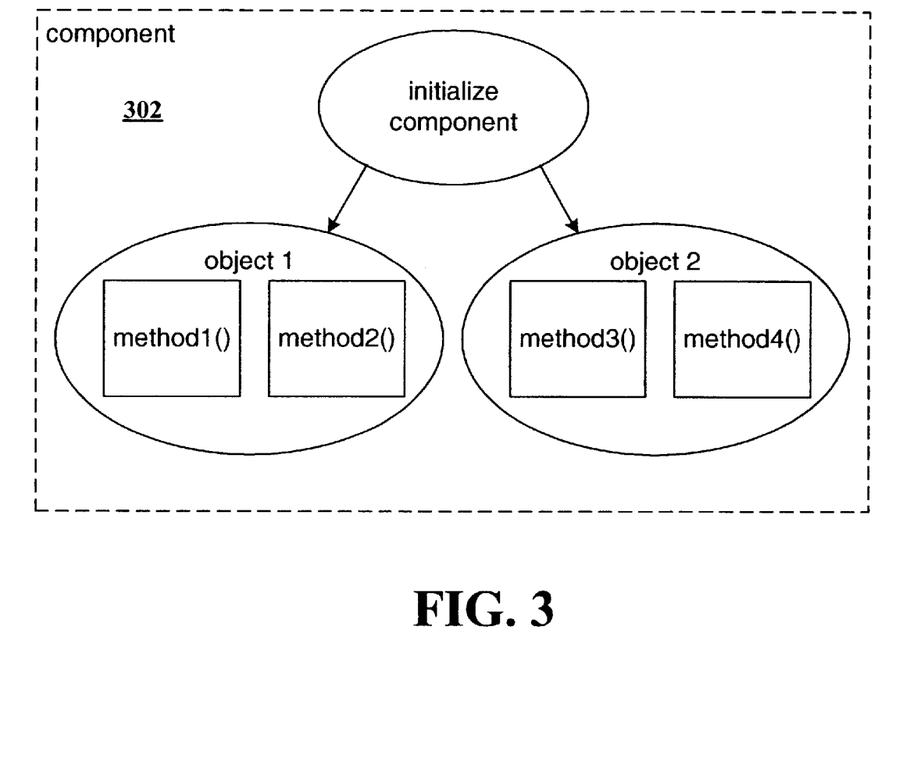
FIG. 3 is an object diagram of an example component.

FIG. 3 is an object diagram of an example component. Component 302 includes an initialize component that packages object 1 and object 2. Initialize component 302 provides an easy way for a user to access the methods of objects 1 and 2 without having to learn the signatures and return types of the methods. Thus, the initialize component may be viewed by the user as a black box that performs a specific function. Furthermore, different test sequences that use the initialize function will be consistent in how the initialize function is performed since the component is referenced rather than the possible variations in how methods 1–4 are invoked.

An example use for components in the context of test flows is interactions with a relational database. Without a component-based interface, a user would need to specify the following code to collect required data in a test flow.

```
...
Use dbEntries;
Use CodeUtils;
my$oraObj = new dbEntries;
my $pcObj = new codeUtils;
my $passcode = $pcObj->generate PassCodes();
$oraObj->createArchStatistics ($passcode);
$oraObj->createExecStatistics ($passcode);
$oraObj->selfValidate();
...
```

In contrast, a component-based approach can simplify the data base access, as illustrated by the code below.

```
use compLibs;
my $comp = new CompLibs;
$comp->dbComponent();
```

The component can be implemented with the following code:

```
sub dbComponent()
{
use lib$ENV(COMPONENT_LIB}"
use dbEntries;
use codeUtils;
my $oraObj = new dbEntries;
my $pcObj = new codeUtils;
my $passcode = $pcObj->genPassCodes();
if (defined $ENV{ARCHSTATS}) {
    $oraObj->createArchStatistics ($passcode);
}
if (defined $ENV{EXECSTATS}){
    $oraObj->createExecStatistics ($passcode);
}
$oraObj->selfValidate();
$oraObj->DESTROY; #implicit
$pcObj->DESTROY; #implicit
}
```

From the example code above it can be seen that components can greatly simplify implementation of test flows. Components can also be plugged-and-played across networks, applications, languages, tools, and operating systems.

Executing flows across networks is accomplished with different software installations applicable for a network environment. For example, the cadSet class has methods that interpret the software installations using site specific data files. The components built using the cadSet class will automatically detect which network (site) on which the flow is executing and ensure that the correct site specific data are interpreted.

The following example illustrates how components are implemented to provide plug-and-play capabilities across different programming languages. The example component implements the task of determining the total free swap of a machine. This can be accomplished using a UNIX specific stand alone application called, "swap", which can be directly invoked from APIs provided in languages such as Perl. For more system-specific and accurate data, kernel memory is read in UNIX and the data are provided to a Win32 API on a Windows machine. The latter implementation should be in a compiled language such as C++. From a user's perspective, the implementation language is irrelevant since the component provides the function of finding the swap space.

Components are implemented to provide plug-and-play across tools. Every flow file contains a set of tools or applications that are to be interpreted and executed. If, for example, after the execution of the flow that includes a set of software builds the user decides to change the flows completely or make minor modifications to the flow, the components that process these flows do not require any change since the information of the tools to be executed and how to execute them ("signatures") are created at runtime by running the flow file interpreter method on a flow file.

Figure 4:
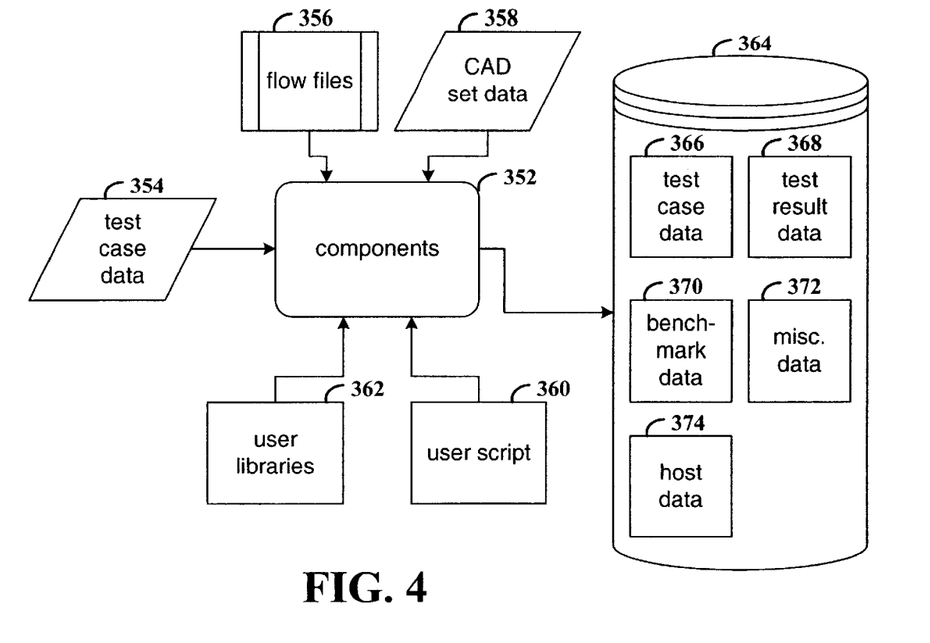
FIG. 4 is a block diagram that illustrates the relationships between components and the other elements in an object-oriented system for testing electronic circuit designs.

FIG. 4 is a block diagram that illustrates the relationships between components and the other elements in an object-oriented system for testing electronic circuit designs. Components 352 reference and use test case data 354, flow files 356, CAD set data 358, and user libraries 362.

Test case data 354 includes EDIF, VHDL, and Verilog files, for example. Flow files 356 are those as described above. CAD set data 358 includes file server locations of various executables and/or license files as well as definitions of internal variables that customize the functionality of various components.

User scripts 360 are scripts written by a user that reference selected ones of the components 352. The user libraries are user-specific classes that may or may not be referenced by the components, depending on the particular component.

Components 352 includes methods for interfacing with database 364. Database 364 includes various data that are used in running a test flow as well as data that are generated in running the test flow. For example, test case data 366 includes data that are input to the tools referenced in a test flow, and test result data 368 includes the data that are output from a test flow.

Benchmark data 370 includes, for example, CPU time, clock frequency, logic cell utilization and other fields that can be used to benchmark the software used to implement an FPGA. Miscellaneous data 372 includes data such as a "change request" filed by an internal user against the particular design, the time at which the execution of a flow on the design manifests a problem (if any).

Host data 374 describes the host computing system (not shown) on a component in a test flow executes. For example, a particular component in a test flow may require a particular swap size when executed on a give host system. The swap size for that host system is associated with the component in the host data 374.

Figure 5:
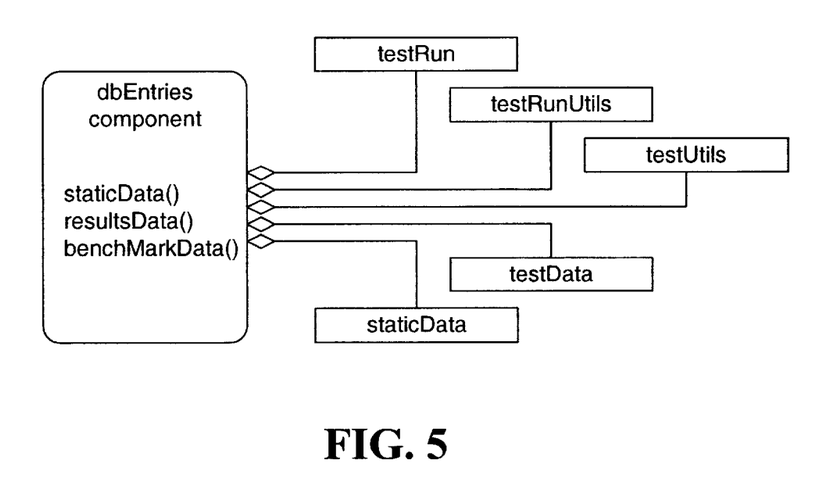
FIG. 5 is an object diagram that illustrates the relationships between the dbEntries component and example classes of ROMs.

FIG. 5 is an object diagram that illustrates the relationships between the dbEntries component and example classes of ROMs 152. The dbEntries component includes the methods, staticData( ), resultsData( ), and benchmarkData( ). These methods can be referenced in a user script to simplify database access.

The staticData( ) method parses the input data files and generates information regarding the primitives and attributes used in the design.

The resultsData( ) method parses the output data files and generates information regarding the status of the flow.

The benchmarkData( ) method parses and analyzes the output files searching for specific parameters and associated values suitable for benchmarking.

The dbEntries component has testRun, testRunUtils, testUtils, testData, and staticData objects. The testRun object contains methods that execute an application on a given test case. The description in the following paragraphs describe the methods contained in the testRun object.

The scriptEndProcess method changes the semaphore created in resultFileInit (in_progress) to 'passed' or "failed" depending on the test status, writes out various spooler files for an ORACLE database and wraps up various output/log files.

The runTest method finds the appropriate executable and executes it in the $RUN:directory. The output (stdout/stderr) will be captured in a file named ".log" by default unless it is overridden by the user. Depending on the success of command execution (return code) a message is written to a results file. CPU times are computed and written into the .log file.

The skipTest method requests the system to not rerun a test which was already processed successfully.

The testRunUtils object is a base class of testRun that includes methods for: 1) creating a consolidated transcript file for the whole flow; 2) determining the application that has failed in a test flow; and 3) run-time binding of the variables that are used in the signature of the application in the flow file. Other methods may be included depending on the particular tools used in the test flows.

The testUtils object includes numerous utility modules that can be used in systems verification testing. Example utilities print data, manipulate semaphores, manipulate handles, etc.

The testData object is a base class for testRun which contains test data management routines and includes the following methods:

The caseVerify method verifies whether the testcase input netlist exists in a selected directory.

The getGenericHDLFromRepository method automatically extracts HDL files from the repository based on the HDL variable and testcase name.

The getDataFromRepository method automatically extracts the design directory contents from the repository based on the testcase name, family name and flow name.

The getDataFromDesign method automatically extracts design files for a different design from the repository based on the additional testcase name, family name and flow name.

The getFlattenedDataFromRepository method automatically extracts design files for the design from the repository based on the testcase name, family name and flow name.

The copyToRun method copies filename extensions or filenames themselves from the input parameters to the output stream.

The cleanup method takes in a list of file name extensions and deletes them up from the RUN directory.

The zipFiles method takes in a list of file name extensions and zips them up in the RUN directory.

The staticData object creates a static test case summary to be used in creating the design database and includes the following methods:

The createStaticData method creates static design information data that is suitable for the results database table.

The returnData method returns a reference to the data captured.

The genTable method creates a database table with the specified data.

Figure 6:
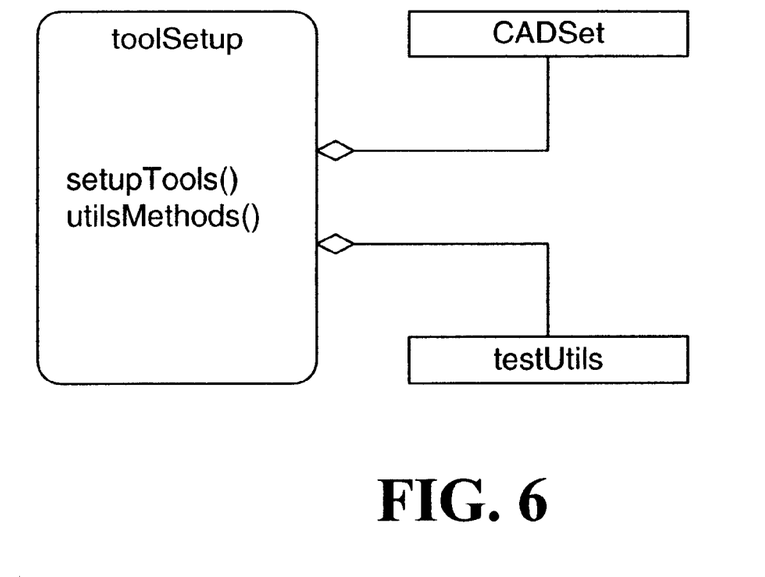
FIG. 6 is an object diagram that illustrates the relationships between the toolSetup component and examples classes of ROMs.

FIG. 6 is an object diagram that illustrates the relationships between the toolSetup component and example classes of ROMs 152. The toolSetup component includes setupTools( ) and utilsMethods( ) methods and has CADset and testUtils objects (the testUtils object was described above).

The setupTools( ) method reads the site specific data files and sets up all the variables including PATH variable and license server information for the application to be executed. The setup is valid for the current program environment.

The utilsMethods( ) method contains utilities that are required for executing the setupTools( ) method.

The CADset object sets up any tool on any platform using a site specific data file, ROMS/data/setupData. The CADset object includes the methods described below:

The setupTools method sets up the environment for all the requested tools. This method is generally used to set up any software environment. Depending the site, this method finds the appropriate setupData file from the ROMS/data area and uses the tools defined therein.

The unsetTools method unsets the variables for the tools that the setupTools method was using.

The expandInternalROMsVars method expands variables in situations where there are setup files, for example, synopsys_setup, that require pointers to various compiled library paths.

The getallTools method lists all tools supported for a given site.

The sourceTools method recreates the environment used by a script using the cadSet variable outside of the script.

Figure 7:
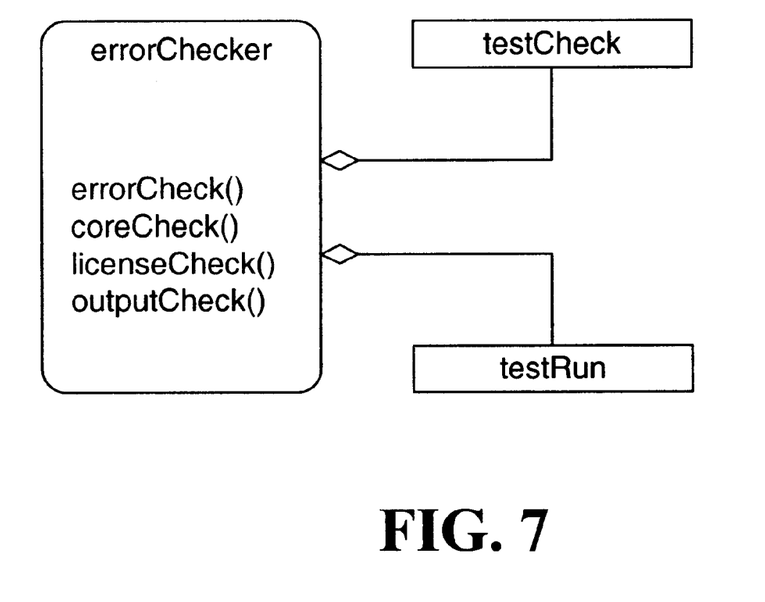
FIG. 7 is an object diagram that illustrates the relationships between the errorChecker component and example classes of ROMs.

FIG. 7 is an object diagram that illustrates the relationships between the errorChecker component and example classes of ROMs 152. The errorChecker component includes member methods errorCheck( ), coreCheck( ), licenseCheck( ), and outputCheck( ) and has objects of testCheck and testRun.

The errorCheck( ) method parses the log files and determines whether the applications reported an error.

The coreCheck( ) method checks whether execution of an application resulted in a page fault or core dump.

The licenseCheck( ) method checks whether a license is available for use for a given application.

The outputCheck( ) method checks whether the correct output data has been generated for a given application.

The testCheck object checks the execution of the tests in the test flow and includes the following methods:

The checkTest method checks for system errors (e.g., core dumps), application errors, place-and-route errors, and the existence of an output file.

The coreCheck method checks for an application core dump.

The diskCheck method checks whether an application ran out of disk space.

The memoryCheck method checks whether an application ran out of memory.

The outputExist method checks for existence of given output file or directory.

The parNotDone method checks a log file to confirm that place-and-route (par) ran to completion The parNoRoute method checks the log file to confirm that par routed successfully.

The licenseFail method checks the log file for license failures.

The mismatchCheck method performs a line-by-line comparison of two files.

The errorStringCheck method searches for a string in a file.

The vendorLicenseAvail method loops until licenses become available or a timeout occurs.

The parNcdList method checks specified directory for design files.

The testRun object of the errorChecker component is the same ROM as described above in reference to FIG. 5.

Figure 8:
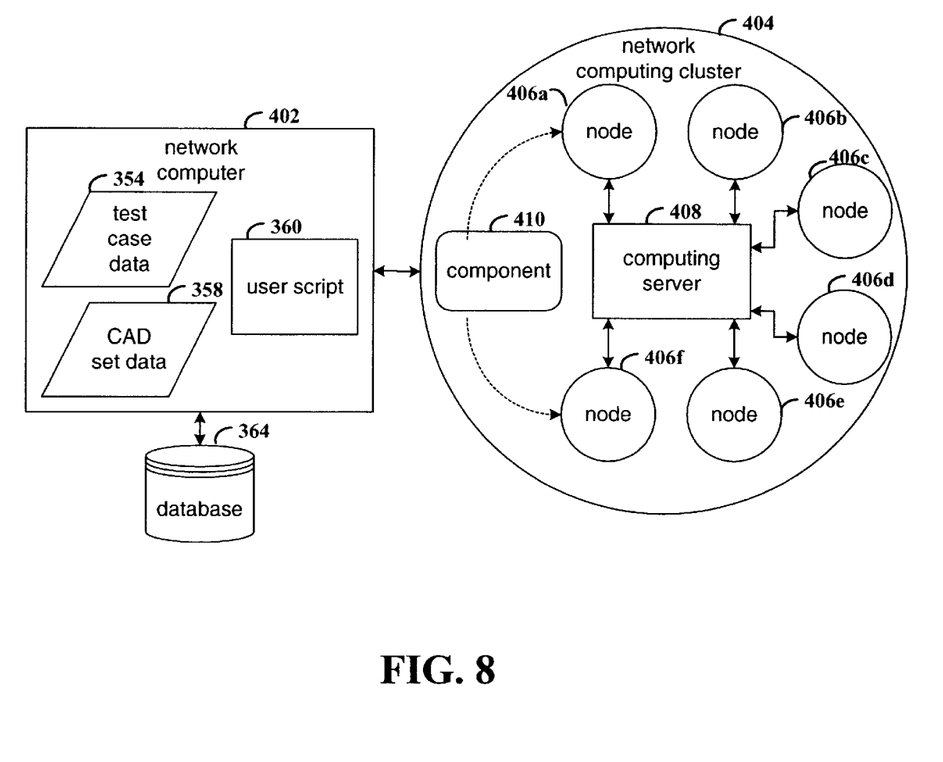
FIG. 8 is a functional block diagram of a system for network execution of components in a test flow.

FIG. 8 is a functional block diagram of a system for network execution of components in a test flow. Network computer 402 hosts test case data 354, CAD set data 358, user script 360, and database 364 as previously described. Network computing cluster 404 includes a plurality of computing nodes 406a–f that are coupled to computing server 408. Network computer 402 and nodes 406a–f are coupled to computing server 408 via a conventional network arrangement, for example, a LAN, WAN, Internet, intranet, etc. Component 410 is an example component that is referenced by user script 360, sent to computer server 408, and dispatched to one of nodes 406a–f for execution.

The component does not need the flow files, data files, and ROMS to be present on a node when executing as long as these files are available on a central file server in the same network where the Network File System (NFS) can be used.

Computing server 408 is configured with a variety of factors to select the node on which a component will execute. For example, users can configure the computing server to select a node based on the node name, CPU speed, memory availability, processor architecture type and other known characteristics.

The present invention is believed to be applicable to a variety of systems for testing electronic circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for structured use of a plurality of software tools for testing an electronic circuit design, comprising:

instantiating one or more flow files, each flow file describing an execution sequence for select ed ones of the plurality of software tools;

instantiating a first set of objects containing one or more methods for interfacing with a selected one or more of the flow files;

instantiating a second set of objects containing one or more methods for collecting data from the software tools and entering the data in a database;

instantiating one or more components that package selected ones of the first set and second set of objects, wherein selected ones of the components include one or more methods that invoke one or more methods of the first and second sets of objects; and invoking selected ones of the methods of the components.

2. The method of claim 1, further comprising:

providing the first and second sets of objects, the components, and the database on one or more computers coupled to a computer network; and executing the selected ones of the methods of the components on selected ones of the one or more computers.

3. The method of claim 1, further comprising:

collecting a first set of data in executing a flow file, the data identifying the selected ones of the software tools and result data generated by the selected ones of the software tools; and storing the first set of data in the database.

4. The method of claim 3, further comprising:

collecting a second set of data in executing a flow file, the second set of data including test data input to the selected ones of the software tools; and associatively storing in the database the second set of data with the first set of data.

5. The method of claim 1, wherein a first type of the one or more components has an object with a method that executes one of the tools and one of the one or more components is the first type, and further comprising invoking the method that executes one of the tools.

6. The method of claim 5, wherein the first type of the one or more components has an object with a method that obtains test data from a repository, and further comprising invoking the method that obtains test data.

7. The method of claim 6, wherein a second type of the one or more components includes a method that establishes site-specific operating parameters for the software tools, and further comprising invoking the method that establishes site-specific operating parameters.

8. The method of claim 7, wherein a third type of the one or more components includes a method that checks for presence of an error code in a file designated by the site-specific operating parameters, and further comprising invoking the method that checks for an error code.

9. The method of claim 7, wherein a third type of the one or more components includes a method that checks whether a license is granted for a designated tool, and further comprising invoking the method that checks whether a license is granted.

10. The method of claim 7, wherein a third type of the one or more components includes a method that checks whether contents of memory occupied by a tool was written to a file by an operating system in response to a condition detected by the operating system in executing the tool, and further comprising invoking the method that checks for the contents of the memory in the file.

11. The method of claim 7, wherein a third type of the one or more components includes a method that checks whether insufficient file storage space was encountered while executing a tool, and further comprising invoking the method that checks for insufficient file space.

12. The method of claim 7, wherein a third type of the one or more components includes a method that checks for existence of a file containing output data from a tool, and further comprising invoking the method that checks for existence of the file containing output data.

13. An apparatus for structured use of a plurality of software tools for testing an electronic circuit design, comprising:

means for instantiating one or more flow files, each flow file describing an execution sequence for selected ones of the plurality of software tools;

means for instantiating a first set of objects containing one or more methods for interfacing with a selected one or more of the flow files;

means for instantiating a second set of objects containing one or more methods for collecting data from the software tools and entering the data in a database;

means for instantiating one or more components that package selected ones of the first set and second set of objects, wherein selected ones of the components include one or more methods that invoke one or more methods of the first and second sets of objects; and means for invoking selected ones of the methods of the components.

14. A component-based system for structured use of a plurality of software tools for testing an electronic circuit design, comprising:
- one or more flow files, each flow file describing an execution sequence for selected ones of the plurality of software tools;
- a first set of objects containing one or more methods for interfacing with a selected one or more of the flow files;
- a second set of objects containing one or more methods for collecting data from the software tools and entering the data in a database; and
- one or more components that package selected ones of the first set and second set of objects, wherein selected ones of the components include one or more methods that invoke one or more methods of the first and second sets of objects.

15. The system of claim 14, further comprising:
- a network; and
- a plurality of computer systems coupled to the network, wherein the first and second sets of objects, the components, and the database are deployed on selected ones of the computer systems.

16. The system of claim 15, wherein a first type of the one or more components has an object with a method that executes one of the tools and one of the one or more components is the first type.

17. The system of claim 16, wherein the first type of the one or more components has an object with a method that obtains test data from a repository.

18. The system of claim 6, wherein a second type of the one or more components includes a method that establishes site-specific operating parameters for the software tools.

19. The system of claim 18, wherein a third type of the one or more components includes a method that checks for presence of an error code in a file designated by the site-specific operating parameters.

20. The system of claim 18, wherein a third type of the one or more components includes a method that checks whether a license is granted for a designated tool.

21. The system of claim 18, wherein a third type of the one or more components includes a method that checks whether contents of memory occupied by a tool was written to a file by an operating system in response to a condition detected by the operating system in executing the tool.

22. The system of claim 18, wherein a third type of the one or more components includes a method that checks whether insufficient file storage space was encountered while executing a tool.

23. The system of claim 18, wherein a third type of the one or more components includes a method t hat checks for existence of a file containing output data from a tool.

* * * * *